(12) United States Patent
Rayaprolu et al.

(10) Patent No.: US 11,393,541 B2
(45) Date of Patent: Jul. 19, 2022

(54) MITIGATING A VOLTAGE CONDITION OF A MEMORY CELL IN A MEMORY SUB-SYSTEM

(71) Applicant: Micron Technology, Inc., Boise, ID (US)

(72) Inventors: Vamsi Pavan Rayaprolu, San Jose, CA (US); Kishore Kumar Muchherla, Fremont, CA (US); Peter Feeley, Boise, ID (US); Sampath K. Ratnam, Boise, ID (US); Sivagnanam Parthasarathy, Carlsbad, CA (US); Qisong Lin, El Dorado Hills, CA (US); Shane Nowell, Boise, ID (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 17/129,627

(22) Filed: Dec. 21, 2020

(65) Prior Publication Data
US 2021/0109805 A1   Apr. 15, 2021

Related U.S. Application Data

(62) Division of application No. 16/045,641, filed on Jul. 25, 2018, now Pat. No. 10,872,009.
(Continued)

(51) Int. Cl.
*G11C 16/34* (2006.01)
*G06F 11/07* (2006.01)
(Continued)

(52) U.S. Cl.
CPC ............ *G11C 16/34* (2013.01); *G06F 3/0619* (2013.01); *G06F 3/0634* (2013.01);
(Continued)

(58) Field of Classification Search
CPC ......... G11C 16/34; G11C 16/10; G11C 16/14; G11C 16/26; G11C 16/3418;
(Continued)

(56) References Cited

U.S. PATENT DOCUMENTS

| 7,120,060 B2 * | 10/2006 | Pekny | G11C 16/3468 365/185.24 |
| 8,908,460 B2 * | 12/2014 | Mun | G11C 13/0007 365/189.011 |

(Continued)

FOREIGN PATENT DOCUMENTS

WO   2013096830   6/2013

OTHER PUBLICATIONS

Cai et al., Read Disturb Errors in MI-C NAND Flash Memory: Characterization, Mitigation, and Recovery, 2015, IEEE, pp. 438-449. (Year: 2015).

(Continued)

*Primary Examiner* — John J Tabone, Jr.
(74) *Attorney, Agent, or Firm* — Lowenstein Sandler LLP

(57) ABSTRACT

A determination that a programming operation has been performed on a memory cell can be made. An amount of time that has elapsed since the programming operation has been performed on the memory cell can be identified. A determination as to whether the amount of time that has elapsed satisfies a threshold time condition can be made. In response to determining that the amount of time that has elapsed satisfies the threshold time condition an operation can be performed on the memory cell to change or maintain a voltage condition of the memory cell.

17 Claims, 8 Drawing Sheets

Related U.S. Application Data

(60) Provisional application No. 62/628,198, filed on Feb. 8, 2018.

(51) Int. Cl.

| | | |
|---|---|---|
| *G11C 16/10* | (2006.01) | |
| *G11C 29/00* | (2006.01) | |
| *G11C 16/26* | (2006.01) | |
| *G11C 16/14* | (2006.01) | |
| *G06F 3/06* | (2006.01) | |
| *G11C 16/04* | (2006.01) | |

(52) U.S. Cl.
CPC .......... *G06F 3/0679* (2013.01); *G06F 11/073* (2013.01); *G06F 11/076* (2013.01); *G06F 11/079* (2013.01); *G06F 11/0793* (2013.01); *G11C 16/10* (2013.01); *G11C 16/14* (2013.01); *G11C 16/26* (2013.01); *G11C 16/3418* (2013.01); *G11C 16/3427* (2013.01); *G11C 16/3445* (2013.01); *G11C 16/3459* (2013.01); *G11C 29/00* (2013.01); *G11C 29/84* (2013.01); *G11C 16/0483* (2013.01); *G11C 2207/229* (2013.01); *G11C 2207/2272* (2013.01); *G11C 2207/2281* (2013.01)

(58) Field of Classification Search
CPC ............ G11C 16/3427; G11C 16/3445; G11C 16/3459; G11C 29/00; G11C 16/0483; G11C 29/84; G11C 2207/2281; G11C 2207/229; G11C 2207/2272; G06F 11/0793; G06F 3/0619; G06F 3/0634; G06F 3/0679; G06F 11/073; G06F 11/076; G06F 11/079
USPC ........ 714/721, 718, 719, 704, 763; 365/200, 365/201
See application file for complete search history.

(56) References Cited

U.S. PATENT DOCUMENTS

| | | | | |
|---|---|---|---|---|
| 8,938,655 | B2* | 1/2015 | Hamilton | G11C 16/3418 714/763 |
| 8,958,233 | B2* | 2/2015 | Chen | G11C 11/1693 365/148 |
| 9,001,573 | B1* | 4/2015 | Fantini | G11C 13/0061 365/210.1 |
| 9,047,984 | B2* | 6/2015 | Hu | G11C 16/26 |
| 9,064,563 | B2* | 6/2015 | Khoueir | G11C 13/0004 |
| 9,208,023 | B2* | 12/2015 | Lasser | G06F 11/1072 |
| 9,224,471 | B2* | 12/2015 | Chen | G11C 13/0004 |
| 9,263,128 | B2* | 2/2016 | Fantini | G11C 13/0033 |
| 9,269,450 | B2* | 2/2016 | Radke | G11C 16/26 |
| 2005/0122831 | A1 | 6/2005 | Roohparvar | |
| 2006/0268611 | A1* | 11/2006 | Srowik | G11C 16/12 365/185.14 |
| 2008/0137413 | A1* | 6/2008 | Kong | G11C 11/5628 365/185.03 |
| 2009/0046510 | A1* | 2/2009 | Song | G11C 16/0483 365/185.03 |
| 2009/0161466 | A1* | 6/2009 | Hamilton | G11C 16/10 365/222 |
| 2012/0236641 | A1* | 9/2012 | Hu | G11C 16/26 365/185.03 |
| 2012/0240007 | A1* | 9/2012 | Barndt | H03M 13/3707 714/E11.03 |
| 2013/0166972 | A1* | 6/2013 | Seabury | G11C 29/021 714/708 |
| 2014/0226388 | A1* | 8/2014 | Khoueir | G11C 13/0035 365/163 |
| 2014/0281769 | A1* | 9/2014 | Ohshima | G11C 29/42 714/721 |
| 2015/0213891 | A1* | 7/2015 | Fantini | G11C 13/0033 365/163 |
| 2015/0357043 | A1* | 12/2015 | Im | G11C 16/28 365/185.11 |
| 2015/0380098 | A1* | 12/2015 | Koudele | G11C 16/28 365/185.11 |
| 2018/0203613 | A1* | 7/2018 | Tanzawa | G11C 11/5671 |
| 2018/0276072 | A1* | 9/2018 | Kodama | G11C 16/26 |
| 2019/0250843 | A1* | 8/2019 | Ratnam | G06F 3/0673 |

OTHER PUBLICATIONS

Gao et al., Exploit Asymmetric Error Rates of Cell States to Improve the Performance of Flash Memory Storage Systems, 2014, IEEE, pp. 202-207 (Year: 2014).

International Search Report and Written Opinion for Application No. PCT/US2019/016421 dated May 17, 2019, 13 pages.

\* cited by examiner

| 1 | | |
|---|---|---|
| 510 | 520 | 530 |
| | Data | 2 |
| 540 | 550 | 560 |
| | 3 | |
| 570 | 580 | 590 |

FIG. 5A

| 1 | | |
|---|---|---|
| 510 | 520 | 530 |
| 2 | Data | 2 |
| 540 | 550 | 560 |
| | 5 | |
| 570 | 580 | 590 |

FIG. 5B

MITIGATING A VOLTAGE CONDITION OF A MEMORY CELL IN A MEMORY SUB-SYSTEM

RELATED APPLICATIONS

This application is a divisional under 35 U.S.C. § 120 of U.S. patent application Ser. No. 16/045,641, filed on Jul. 25, 2018, which claims the benefit under 35 U.S.C. § 119(e) of U.S. Provisional Patent Application No. 62/628,198, filed on Feb. 8, 2018, which are incorporated herein by reference.

TECHNICAL FIELD

The present disclosure generally relates to a memory sub-system, and more specifically, relates to mitigating a voltage condition of a memory cell in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 5A illustrates operations on proximate memory cells that change the voltage condition of a particular memory cell in accordance with some embodiments of the present disclosure.

FIG. 5B illustrates operations on proximate memory cells that that change the voltage condition of the particular memory cell so that the voltage condition is to be mitigated in accordance with some embodiments of the present disclosure.

DETAILED DESCRIPTION

Figure 1:
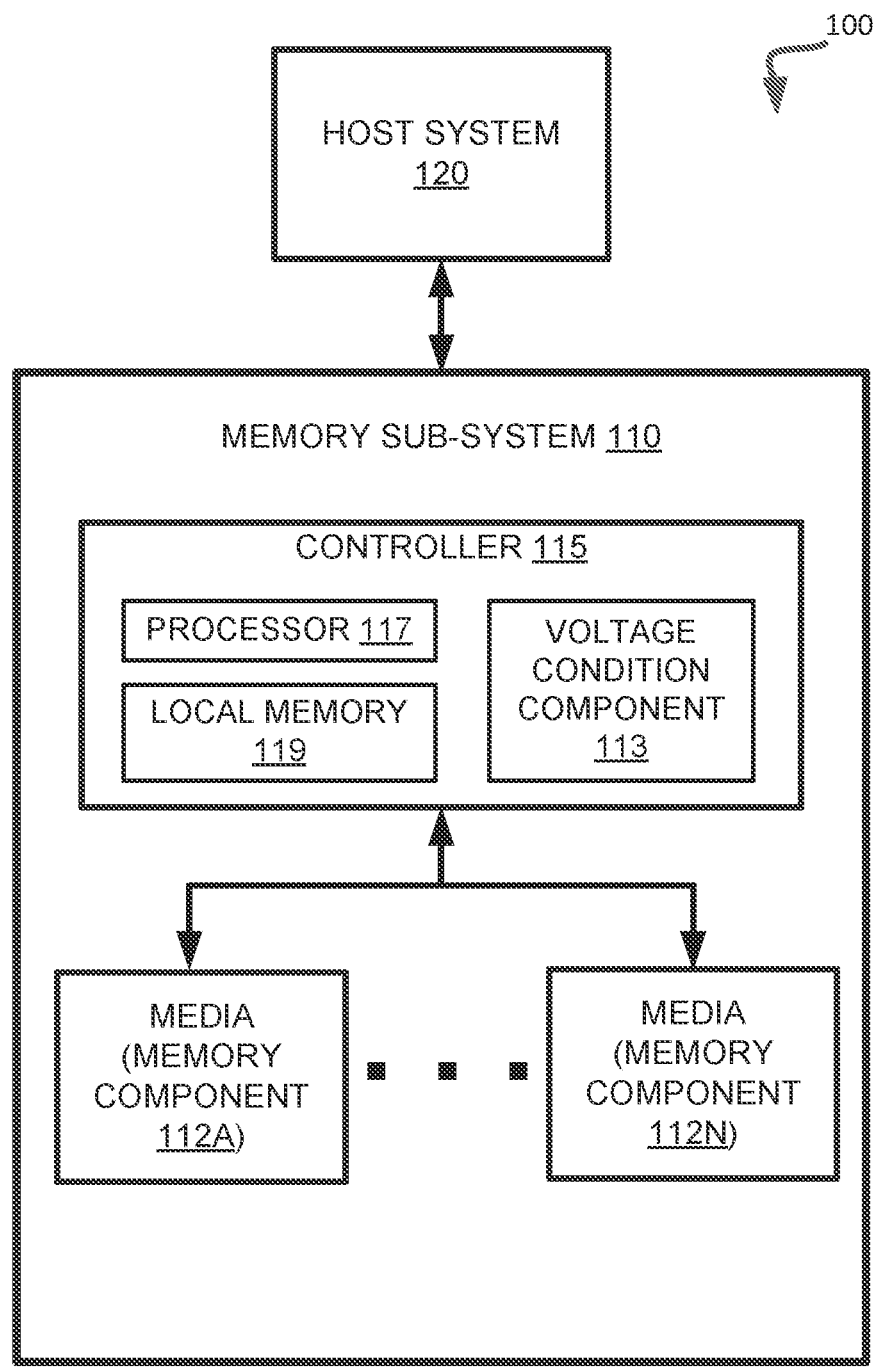
FIG. 1 illustrates an example computing environment that includes a memory sub-system in accordance with some embodiments of the present disclosure.

Aspects of the present disclosure are directed to mitigating a voltage condition of a memory cell in a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Each memory component can include multiple memory cells where each memory cell can store one or more bits of binary data corresponding to data received from the host system. A conventional memory sub-system can store the data at a particular memory cell by performing two programming passes (or any number of programming passes) that each program or store data at the memory cell. For example, a first programming pass can program data at the memory cell at a particular time. At a later time, a second programming pass can be performed on the memory cell to store additional data at the memory cell and the second programming pass requires and uses the information stored in the first pass programming. A certain amount of time can elapse between the memory sub-system performing the first programming pass and performing the second programming pass on the same memory cell.

The state or condition of the memory cell can change during the amount of time that has elapsed between the memory sub-system performing the first programming pass and the second programming pass on the memory cell. For example, the memory cell can be at an initial voltage condition after the first programming pass is used to perform a programming operation on the memory cell. The initial voltage condition corresponds to a transient threshold voltage ($V_t$) state. In some embodiments, the transient $V_t$ state can be a physical state of the memory cell where electrons of the memory cell are distributed throughout the memory cell. After the first programming pass has been performed and time elapses and other operations are not performed on the memory cell, the memory cell can transition from the initial voltage condition or state to another voltage condition or state. For example, the memory cell can transition to a stable threshold voltage ($V_t$) state which corresponds to another physical state of the memory cell where the electrons of the memory cell are not distributed throughout the memory cell. Instead, the electrons can be distributed towards the edges or exterior of the memory cell.

The changing of the voltage condition of the memory cell from the transient $V_t$ state to the stable $V_t$ state can result in the data stored at the memory cell by the first programming pass being incorrectly read or retrieved when performing the second programming pass. For example, the data that was programmed to the memory cell by the first programming pass will subsequently be read from the memory cell and used to store the additional data at the memory cell during the second programming pass. However, if the memory cell has transitioned from the transient $V_t$ state to the stable $V_t$ state after the first programming pass was performed on the memory cell and before the second programming pass is performed on the memory cell, then errors can be more frequent in the data read from the memory cell. As such, the transient $V_t$ state can correspond to a state of the memory cell where data stored at the memory cell can be read or retrieved with a decreased error rate when compared with the stable $V_t$ state where the data stored at the memory cell can be read or retrieved with an increased error rate. Thus, in a conventional memory sub-system, an increased use of error detection and correction operations (i.e., error control operations) should be performed to correct the errors in the data before programming additional data to the memory cell as part of the second programming pass. The increased use of the error control operation can result in a reduction of performance of the conventional memory sub-system as fewer read operations and write operations from the host system can be performed while additional error control operations are being performed by the memory sub-system.

Furthermore, in other conventional memory systems, if no error control operation is performed on the data that was stored from the first pass programming before the second pass programming is performed, then the data can include a larger number of bit errors if a corresponding memory cell is in the stable Vt state, resulting in write-in errors for the data. Such write-in errors can deteriorate the correction capability of an error correction operation that uses soft (i.e., reliability) information associated with the data.

Aspects of the present disclosure address the above and other deficiencies by mitigating a voltage condition of a memory cell at a memory sub-system. For example, an operation (e.g., a read operation) can be performed on the memory cell between the performance of the first programming pass on the memory cell and the performance of the second programming pass on the memory cell to start the transition of the memory cell from the stable $V_t$ state to the transient $V_t$ state. Thus, the second programming pass can then be performed when the memory cell is at the transient $V_t$ state and is associated with a decreased error rate.

In some embodiments, the performance of the operation to transition the state of a particular memory cell can be based on other programming passes or operations that have been performed on other memory cells that are proximate to the particular memory cell. For example, the first programming pass can be performed to store data at the particular memory cell and subsequently other programming passes or operations (e.g., write operations or erase operations) can be performed on other memory cells that are proximate in location to the particular memory cell. Such operations performed on the other memory cells can influence the memory cell to transition from the transient $V_t$ state to the stable $V_t$ state. For example, write operations performed on adjacent or proximate memory cells (e.g., other memory cells on the same plane or die of the particular memory cell) can contribute to the particular memory cell transitioning from the transient $V_t$ state to the stable $V_t$ state. As more operations are performed on the proximate memory cells, then the particular memory cell may transition to the stable $V_t$ state more quickly. In some embodiments, a read operation can be performed on the particular memory cell after a threshold number of programming and erase operations have been performed on the proximate memory cells. The read operation can thus initiate the transition of the particular memory cell from the stable $V_t$ state to the transient $V_t$ state. In the same or alternative embodiments, the read operation can be performed on the particular memory cell if a threshold amount of time has elapsed since the first programming pass has been performed on the particular memory cell and before any second programming pass has been performed on the particular memory cell.

Advantages of the present disclosure include, but are not limited to, an increased performance of the memory sub-system as fewer error control operations are to be performed when writing data to the memory sub-system. For example, the second programming pass can be performed on the memory cell when the memory cell is at the transient $V_t$ state when the data stored at the memory cell from the first programming pass can be read with fewer errors. Additionally, the reliability of data stored at the memory cell can be improved as the second programming pass is then performed on the memory cell when the memory cell is at the transient $V_t$ state.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 can include a voltage condition component 113 (e.g., circuitry, dedicated logic, programmable logic, firmware, etc.) to perform an operation on a memory cell to change a voltage condition of the memory cell. In some embodiments, the controller 115 includes at least a portion of the voltage condition component 113. For example, the controller 115 can include a processor 117 (processing device) configured to execute instructions stored in local memory 119 for performing the operations described herein. In some embodiments, the voltage condition component 113 is part of the host system 110, an application, or an operating system.

In some implementations, the voltage condition component 113 can perform an operation on memory cells at the memory components 112A to 112N to transition memory cells from a state of an increased error rate (e.g., the stable $V_t$ state) to another state of a decreased error rate (e.g., the transient $V_t$ state). Further details with regards to the operations of the voltage condition component 113 are described below.

Figure 2:
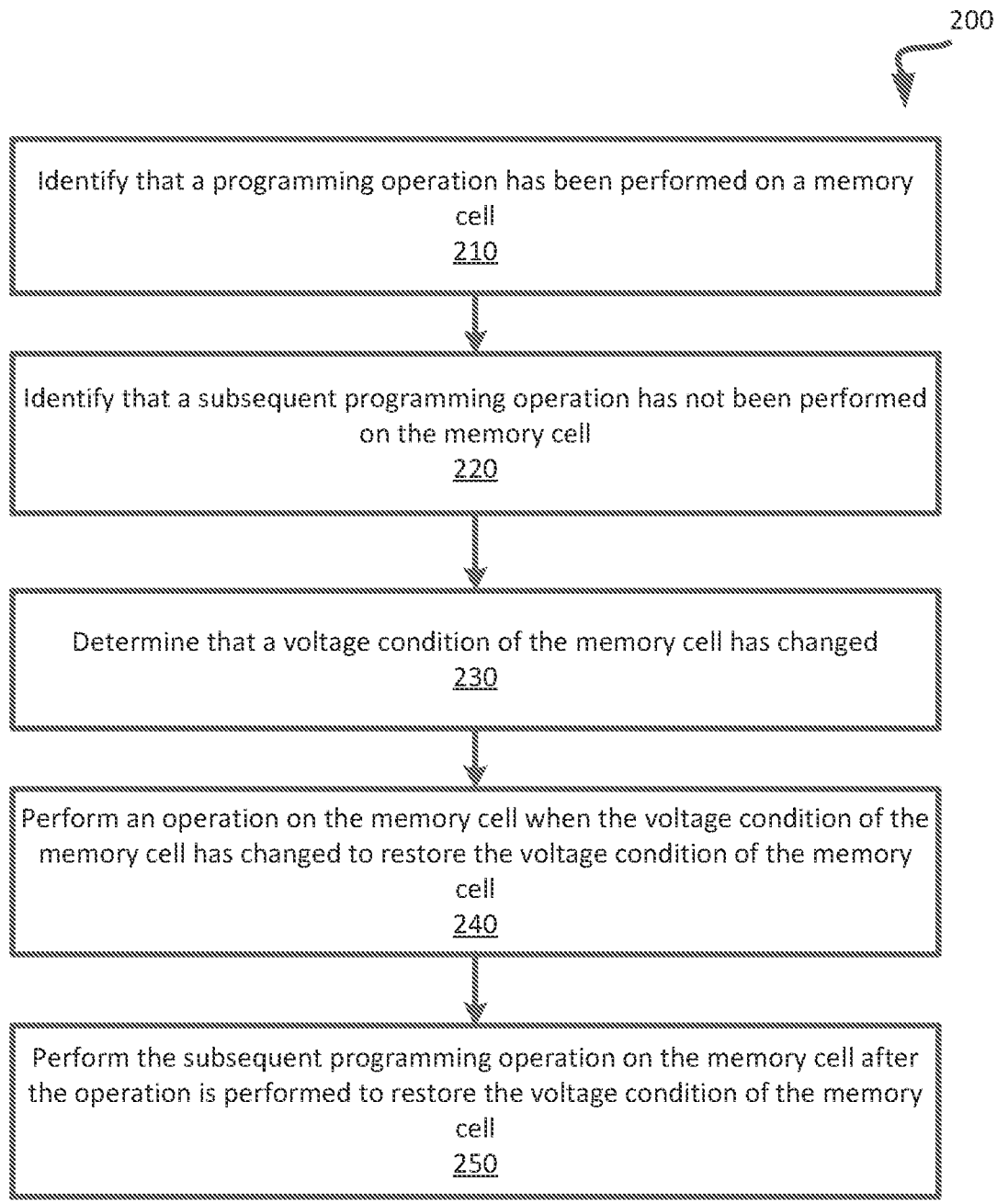
FIG. 2 is a flow diagram of an example method to perform an operation on a memory cell to change a voltage condition of the memory cell in accordance with some embodiments of the present disclosure.

FIG. 2 is a flow diagram of an example method to perform an operation on a memory cell to change a voltage condition of the memory cell in accordance with some embodiments of the present disclosure. The method 200 can be performed by processing logic that can include hardware (e.g., a processing device, circuitry, dedicated logic, programmable logic, microcode, hardware of a device, etc.), software (e.g., instructions run or executed on a processing device), or a combination thereof. In some embodiments, the method 200 is performed by the voltage condition component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at block 210, the processing logic identifies that a programming operation has been performed on a memory cell. In some embodiments, the programming operation is performed on a data block that includes a group of memory cells. As such, operations described herein can be performed on a data block (e.g., a group of memory cells) and/or individual memory cells. For example, the operations described with respect to a memory cell in the present disclosure can also be used with a data block that is a group of memory cells. The programming operation can be performed as part of a first programming pass that programs data at the memory cell of a memory component in a memory sub-system. The first programming pass can be part of a two-pass programming operation that includes a second programming pass that programs additional data at the memory cell after the first programming pass has been performed on the memory cell. At block 220, the processing logic identifies that a subsequent programming operation has not been performed on the memory cell. For example, the memory sub-system can identify that the second programming pass has not been performed on the memory cell (e.g., time has elapsed since the first programming pass). At block 230, the processing logic determines that a voltage condition of the memory cell has changed. For example, the voltage condition can correspond to whether the memory cell has changed from the transient $V_t$ state to the stable $V_t$ state. For example, the memory sub-system can identify whether a threshold number of program/erase operations have been performed at other memory cells that are proximate to the memory cell. Further details with regards to determining whether the voltage condition of the memory cell has changed (e.g., from the transient $V_t$ state to the stable $V_t$ state) based on the threshold number of operations being performed at proximate memory cells are described with regards to FIGS. 4, 5A, and 5B. In the same or alternative embodiments, the memory sub-system can identify that the voltage condition of the memory cell has changed based on a threshold amount of time elapsing since the first programming pass was performed on the memory cell. Further details with regards to determining whether the voltage condition of the memory cell has changed based on the threshold amount of time elapsing are described with regards to FIG. 6. In some embodiments, the memory sub-system can infer or assume that the voltage condition of the memory cell has changed based on the threshold number of operations being performed at proximate memory cells and/or the threshold amount of time elapsing since the first programming pass was performed on the memory cell.

At block 240, the processing logic performs an operation on the memory cell when the voltage condition of the memory cell has changed to restore the voltage condition of the memory cell. For example, the performance of the operation on the memory cell can restore the memory cell to be at the transient $V_t$ state when the memory cell has changed to the stable $V_t$ state. The operation can be, but is not limited to, a read operation that is performed on the memory cell. In some embodiments, the operation can be the application of a voltage to the memory cell or any other operation or action that results in a voltage being applied to the memory cell. At block 250, the processing logic performs the subsequent programming operation on the memory cell after the operation is performed to restore the voltage condition of the memory cell. The subsequent programming operation can be the second programming pass to store additional data at the memory cell when the memory cell has transitioned back to the transient $V_t$ state. The second programming pass uses the data stored at the memory cell that was programmed during the first memory pass.

Figure 3:
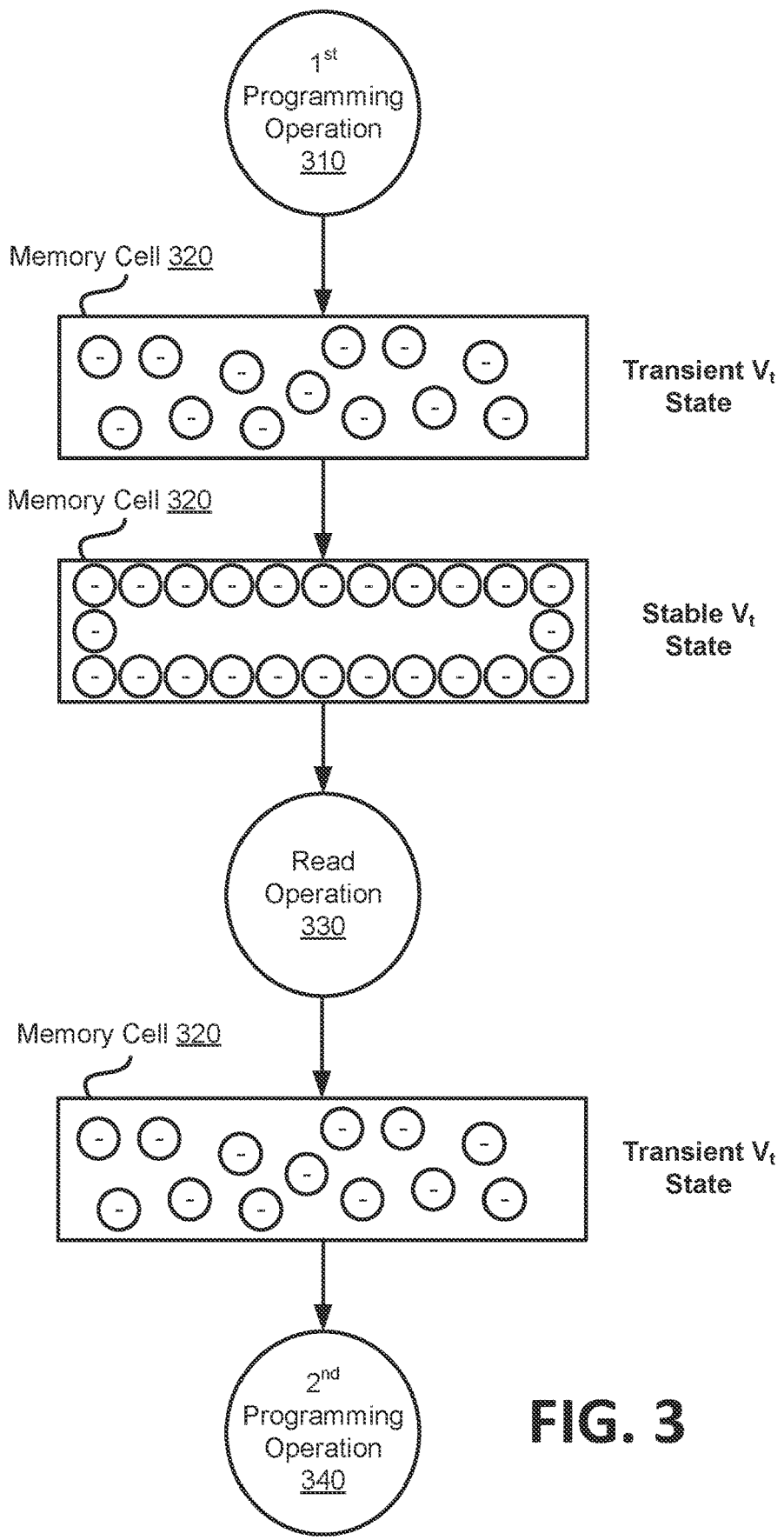
FIG. 3 illustrates voltage conditions or states of a memory cell in accordance with some embodiments of the present disclosure.

FIG. 3 illustrates voltage conditions or states of a memory cell in accordance with some embodiments of the present disclosure. In general, various operations of FIG. 3 can be performed on the memory cell by the voltage condition component 113 of FIG. 1.

As shown in FIG. 3, a first programming operation 310 can be performed on a memory cell. For example, the first programming operation 310 can store data at the memory cell as part of a first programming pass. In some embodiments, the memory cell can store data corresponding to multiple memory pages and the first programming pass can store data corresponding to a portion of the memory pages. The memory cell 320 can be at an initial state after the first programming operation 310 is performed on the memory cell 320. For example, the memory cell 320 can be at the transient $V_t$ state when the data is programmed to the memory cell 320. As time elapses or other program/erase operations are performed on proximate memory cells, the memory cell 320 can progress towards the stable $V_t$ state. Thus, the memory cell can transition from a state where data stored at the memory cell can be read with fewer errors (e.g., a decreased error rate corresponding to the transient $V_t$ state) to a state where data stored at the memory cell can be read with more errors (e.g., an increased error rate corresponding to the stable $V_t$ state). After the memory cell 320 has transitioned to the stable $V_t$ state, a read operation 330 (or another type of operation that applies a voltage to the memory cell 320) can be performed on the memory cell 320 to mitigate the stable $V_t$ state of the memory cell. For example, the read operation 330 can restore the transient $V_t$ state of the memory cell 320. The memory cell 320 can be restored to the transient $V_t$ state after an amount of time that is dependent on the temperature of the memory system. In some embodiments, the second pass programming can be initiated or can start after the amount of time has elapsed so that the memory cell is in the transient $V_t$ state. The second programming operation 340 can be performed on the memory cell 320 after the read operation 330 has been performed on the memory cell 320 to restore the transient $V_t$ state or to initiate a restoration of the transient $V_t$ state. Thus, the second programming operation 340 can be performed on the memory cell 320 after the memory cell 320 has been restored to the transient $V_t$ state.

Figure 4:
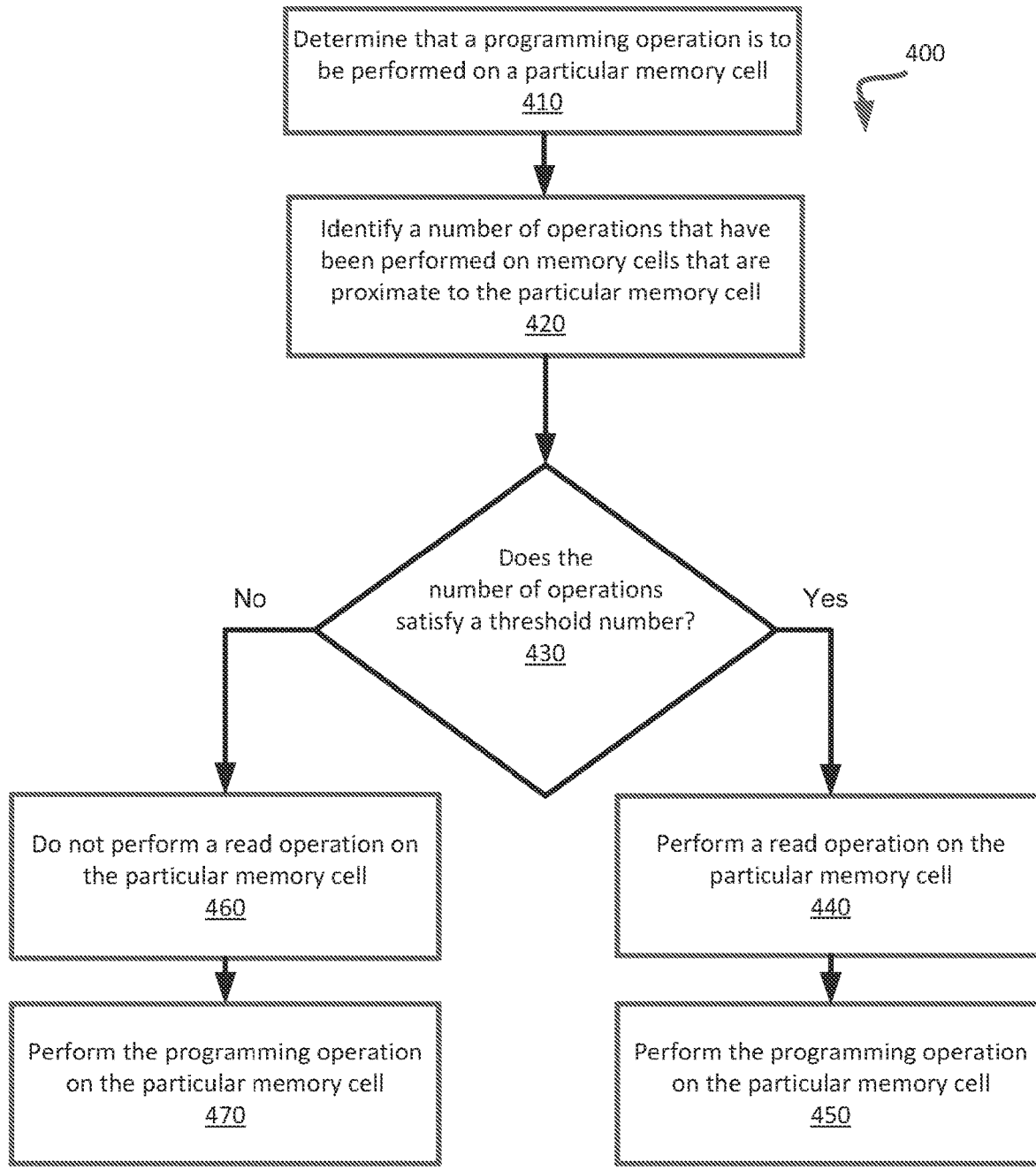
FIG. 4 is a flow diagram of an example method to determine whether to perform an operation on a memory cell to change a voltage condition based on other memory cells in accordance with some embodiments of the present disclosure.

FIG. 4 is a flow diagram of an example method 400 to determine whether to perform an operation on a memory cell to change a voltage condition of the memory cell based on other memory cells in accordance with some embodiments of the present disclosure. In general, the method 400 can be performed by processing logic that can include hardware (e.g., a processing device, circuitry, dedicated logic, programmable logic, microcode, hardware of a device, etc.), software (e.g., instructions run or executed on a processing device), or a combination thereof. The method 400 can be performed by voltage condition component 113 of FIG. 1.

As shown in FIG. 4, at block 410, the processing logic determines that a programming operation is to be performed on a particular memory cell. The programming operation can be part of a second programming pass. For example, the particular memory cell can store data from a prior programming operation from a first programming pass that was performed at a prior time prior time and does not yet store data from a second programming pass. At block 420, the processing logic identifies a number of operations that have been performed on memory cells that are proximate to the particular memory cell. The memory cells that are on a same word line, same plane, and/or a same die as the particular memory cell may be considered to be proximate to the particular memory cell. In some embodiments, memory cells that are within a particular distance of the particular memory cell may be considered to be proximate memory cells. The operations that have been performed on the proximate memory cells can include programming operations (e.g., the storing of data) at the proximate memory cells and/or erase operations to remove data at the proximate memory cells. At block 430, the processing logic determines whether the number of operations satisfies a threshold number. The number of operations performed on the proximate memory cells can be considered to satisfy the threshold number (i.e., a threshold condition) when the number of operations is equal to or exceeds the threshold number and the number of operations can be considered to not satisfy the threshold number when the number of operations is less than the threshold number. If the number of operations satisfies the threshold number or the threshold condition, then at block 440, the processing logic performs a read operation on the particular memory cell. For example, the read operation can be performed on the particular memory cell to change the voltage condition of the particular memory cell from a state of increased errors for the data read at the memory cell (e.g., the stable $V_t$ state) to another state of decreased errors for the data read at the memory cell (e.g., the transient $V_t$ state). At block 450, the processing logic performs the programming operation on the particular memory cell. For example, data can be programmed to the particular memory cell after the read operation has been performed on the particular memory cell to change the voltage condition of the particular memory cell.

Referring to FIG. 4, if the number of operations performed on the proximate memory cells satisfies the threshold number or the threshold condition, then at block 460, then the processing logic determines to not perform a read operation on the particular memory cell. For example, a determination can be made to not perform the read operation to transition the particular memory cell to the transient $V_t$ state as the memory cell can be assumed to not be at the stable $V_t$ state. In some embodiments, other read operations from a host system to retrieve data stored at the particular memory cell can be performed while a read operation intended to transition the particular memory cell to the transient $V_t$ state is not to be performed. At block 470, the processing logic performs the programming operation on the particular memory cell. For example, additional data can be stored at the particular memory cell as part of the second programming pass.

FIG. 5A illustrates operations on memory cells of proximate data blocks that change the voltage condition of memory cells in a particular data block in accordance with some embodiments of the present disclosure. In general, the voltage condition component 113 of FIG. 1 can change the voltage condition of the memory cells of the particular data block based on operations that have been performed on proximate data blocks.

As shown in FIG. 5A, data can be stored at a particular data block 550. In some embodiments, a data block includes a group of memory cells. Data blocks 510, 520, 530, 540, 560, 570, 580, and 590 are proximate to the particular data block cell 550 (e.g., on the same word line, plane, or die). A number of operations performed at the proximate data blocks can be used to determine whether to perform the read operation on the particular memory data block 550 to restore the voltage condition of the particular data block 550. For example, one operation has been performed on the memory cells of the data block 510, two operations have been performed on the memory cells of the data block 560, and three operations have been performed on the memory cells of the data block 580. Thus, the number of operations performed on data blocks that are proximate to the particular data block 550 is six operations. Each of the six operations can contribute towards the memory cells of the particular data block 550 progressing to the stable $V_t$ state. The particular data block 550 can be assumed to be at the stable $V_t$ state when a threshold number of operations have been performed at the proximate data blocks. For example, if the threshold number is ten, then the six operations that have been performed on the proximate data blocks do not exceed the threshold number of operations. As such, the particular data block can be considered to still be at the transient $V_t$ state.

FIG. 5B illustrates operations on proximate data blocks that change the voltage condition of the particular data blocks so that the voltage condition is to be mitigated in accordance with some embodiments of the present disclosure. In general, the voltage condition component 113 of FIG. 1 can change the voltage condition of the particular data block based on operations that have been performed on proximate data blocks.

As shown in FIG. 5B, ten operations have been performed on the memory cells of the proximate data blocks. Since the ten operations is equal to the threshold number, then the operations that have been performed on the proximate data blocks can be considered to have changed the voltage condition of the memory cells of the particular data block 550 to the stable $V_t$ state. As such, a read operation can be performed on the particular data block 550 to transition the memory cells of the particular data block 550 from the stable $V_t$ state to the transient $V_t$ state. In some embodiments, the read operation can be performed on each memory cell of the particular data block 550.

Figure 6:
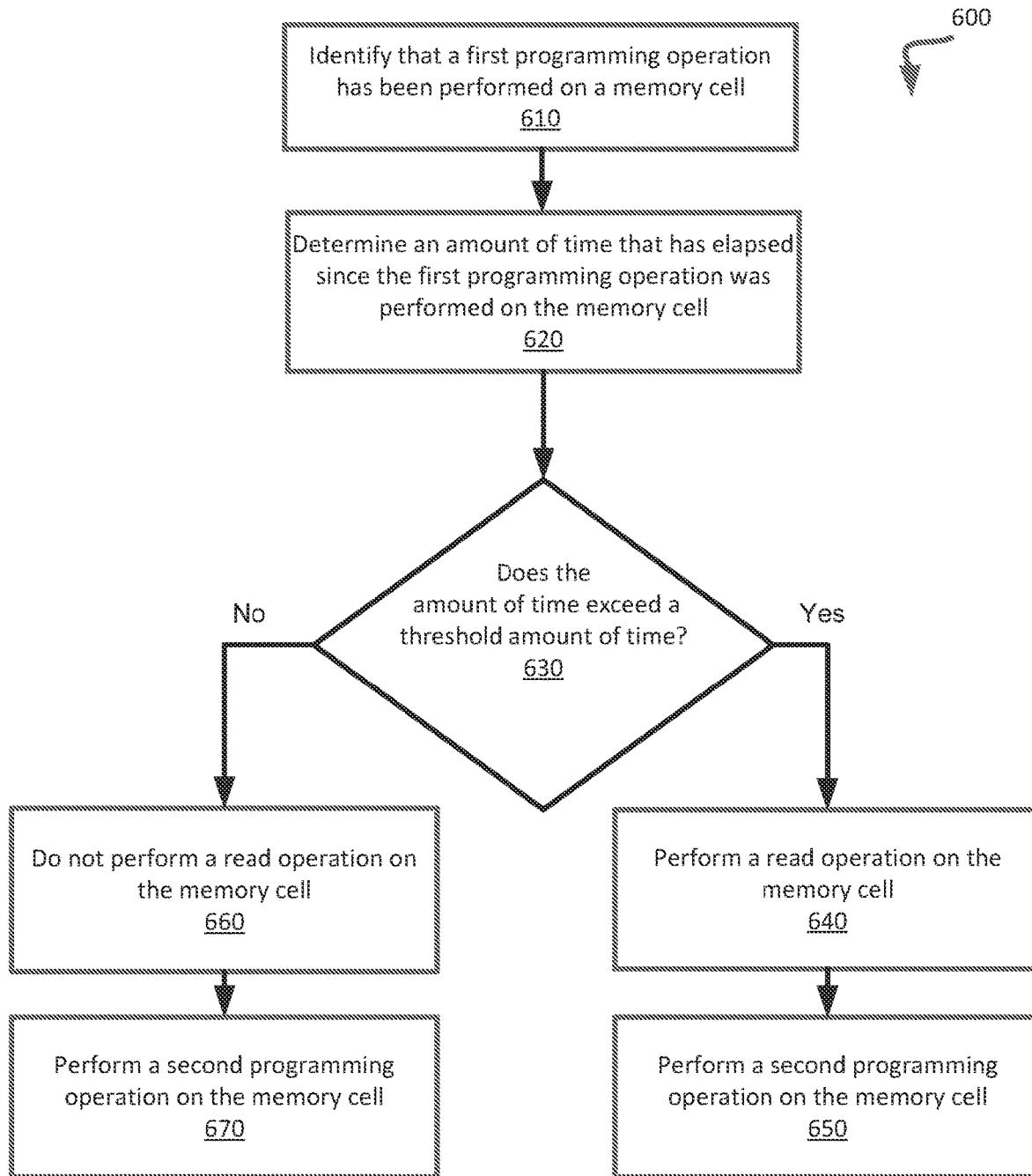
FIG. 6 is a flow diagram of an example method to determine whether to perform the operation on the memory cell to change a voltage condition based on an elapsed time in accordance with some embodiments of the present disclosure.

FIG. 6 is a flow diagram of an example method 600 to determine whether to perform the operation on the memory cell to change a voltage condition based on an elapsed time in accordance with some embodiments of the present disclosure. In general, the method 600 can be performed by processing logic that can include hardware (e.g., a processing device, circuitry, dedicated logic, programmable logic, microcode, hardware of a device, etc.), software (e.g., instructions run or executed on a processing device), or a combination thereof. The method 600 can be performed by voltage condition component 113 of FIG. 1.

As shown in FIG. 6, at block 610, the processing logic identifies that a first programming operation has been performed on a memory cell. The first programming operation can be part of a first programming pass that stores data at the memory cell of a data block. Furthermore, the processing logic can determine that another programming operation of a second programming pass to store additional data at the memory cell has not yet been performed at the memory cell. At block 620, the processing logic determines an amount of time that has elapsed since the first programming operation was performed on the memory cell. The amount of time that has elapsed can correspond to an assumption that the memory cell has transitioned from the transient $V_t$ state to the stable $V_t$ state. In the same or alternative embodiments, the amount of time that has elapsed can correspond to when a read operation should be performed to keep memory cells of the data block at the transient $V_t$ state. At block 630, the processing logic determines whether the amount of time exceeds a threshold amount of time. The memory cells of the data block can be assumed to have transitioned from the transient $V_t$ state to the stable $V_t$ state when the amount of time that has elapsed exceeds (or is equal to) the threshold amount of time (i.e., a threshold time condition). In some embodiments, the threshold amount of time can correspond to an amount of time that a memory sub-system with a memory component that includes the data block has been powered off or not operating. If the amount of time that has elapsed since the first programming operation was performed on the memory cell of the data block exceeds the threshold amount of time, then at block 640, the processing logic performs a read operation on the memory cell to change the voltage condition of the memory cell. The read operation can be an operation that is performed without a request from a host system to retrieve data stored at the memory cell. At block 650, the processing logic performs a second programming operation on the memory cell. For example, the second programming operation can be performed after the read operation is performed on the memory cell to change the voltage condition of the memory cell or to keep the voltage condition of the memory cell. Otherwise, if the amount of time that has elapsed since the first programming operation was performed on the memory cell does not exceed the threshold amount of time, then at block 660, the processing logic determines to not perform the read operation on the memory cell of the data block. Furthermore, at block 670, the processing logic performs the second programming operation on the memory cell.

In some embodiments, the read operation can be performed on each memory cell of a data block that was not programmed with a second programming pass at memory components of the memory sub-system. The read operations can be performed on the memory cells when the memory sub-system has initialized or powered back on after being powered off or not in operation for the threshold amount of time.

Figure 7:
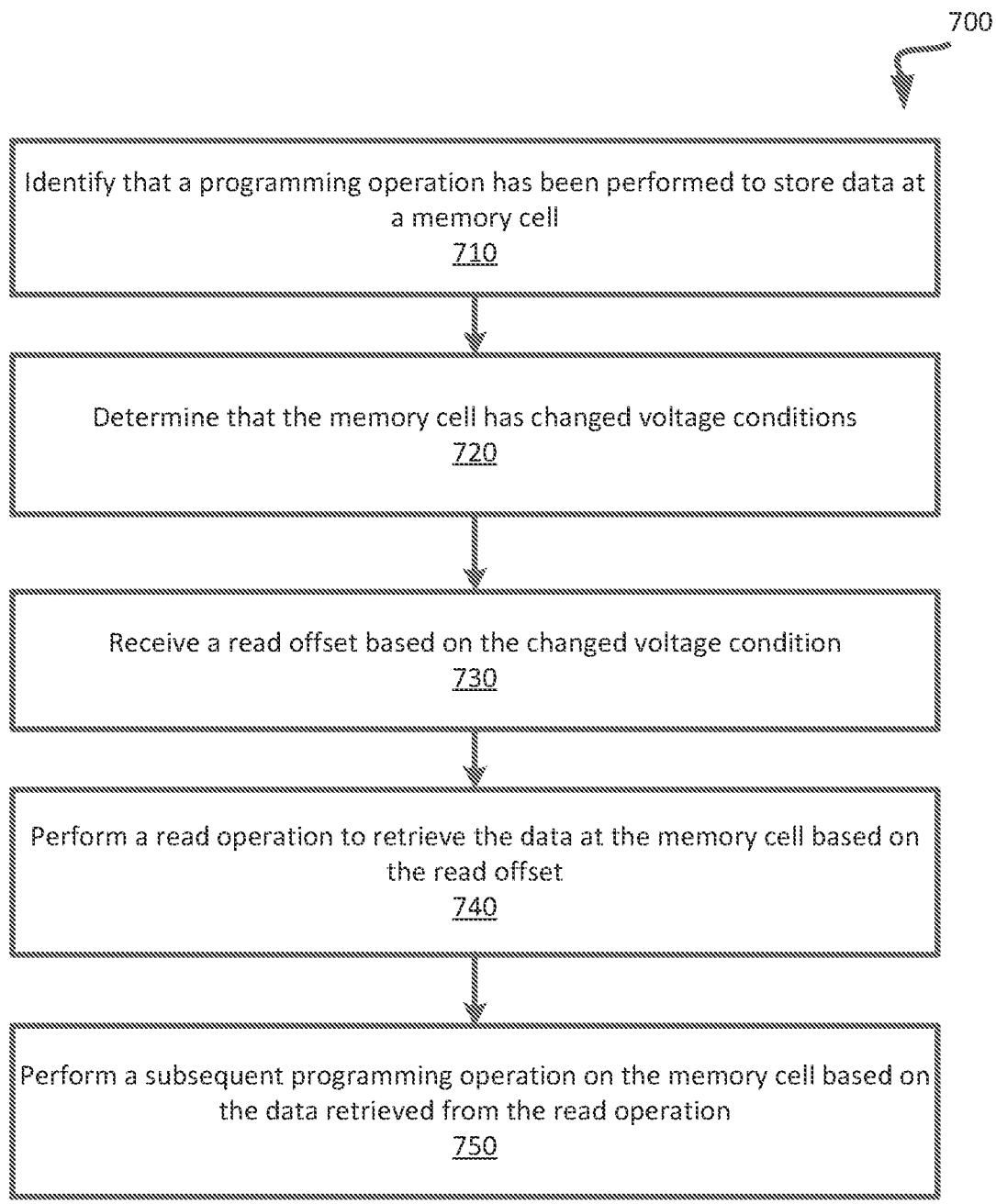
FIG. 7 is a flow diagram of an example method to mitigate a voltage condition of a memory cell based on a read offset in accordance with some embodiments of the present disclosure.

FIG. 7 is a flow diagram of an example method 700 to mitigate a voltage condition of a memory cell based on a read offset in accordance with some embodiments of the present disclosure. In general, the method 700 can be performed by processing logic that can include hardware (e.g., a processing device, circuitry, dedicated logic, programmable logic, microcode, hardware of a device, etc.), software (e.g., instructions run or executed on a processing device), or a combination thereof. The method 700 can be performed by voltage condition component 113 of FIG. 1.

Aspects of the present disclosure may mitigate the voltage condition of the memory cell by applying a read offset that is used to perform a read operation on a particular memory cell that has been assumed to have changed from the transient $V_t$ state to the stable $V_t$ state. For example, as described below, instead of changing the voltage condition of a memory cell that may have transitioned to the stable $V_t$ state, a read offset value can be used to retrieve data stored at the memory cell when the memory cell is considered to have transitioned from the transient $V_t$ state to the stable $V_t$ state.

As shown in FIG. 7, at block 710, the processing logic identifies that a programming operation has been performed to store data at a memory cell. For example, the first programming pass can be performed on the memory cell. At block 720, the processing logic determines that the memory cell has changed voltage conditions. The memory cell can be determined to have changed from the transient $V_t$ state to the stable $V_t$ state when a threshold condition is satisfied. For example, the threshold condition can be satisfied when a threshold number of operations have been performed on proximate memory cells or when a threshold amount of time has elapsed since the programming operation was performed to store the data at the memory cell, as previously described. At block 730, the processing logic receives a read offset based on the changed voltage condition. The read offset can specify a particular threshold voltage to apply to read the data stored at the memory cell that was programmed during the first programming pass. For example, a first threshold voltage can be applied to read data stored at the memory cell when the memory cell is at a transient $V_t$ state and a different second threshold voltage based on the read offset can be applied to read the data stored at the memory cell when the memory cell is at the stable $V_t$ state.

At block 740, the processing logic performs a read operation to retrieve data at the memory cell based on the read offset. For example, the data can be retrieved from the memory cell by applying a threshold voltage to the memory cell that is defined by the read offset. Thus, the second programming pass can be performed by reading the data from the memory cell at the stable $V_t$ state by applying a threshold voltage that is different than the threshold voltage to be applied when reading the data from the memory cell at the transient $V_t$ state. At block 750, the processing logic performs a subsequent programming operation on the memory cell based on the data retrieved from the read operation. For example, a second programming pass can be performed on the memory cell where the additional data stored at the memory cell from the second programming pass is based on values of the data of the first programming pass performed on the memory cell at an earlier time.

Figure 8:
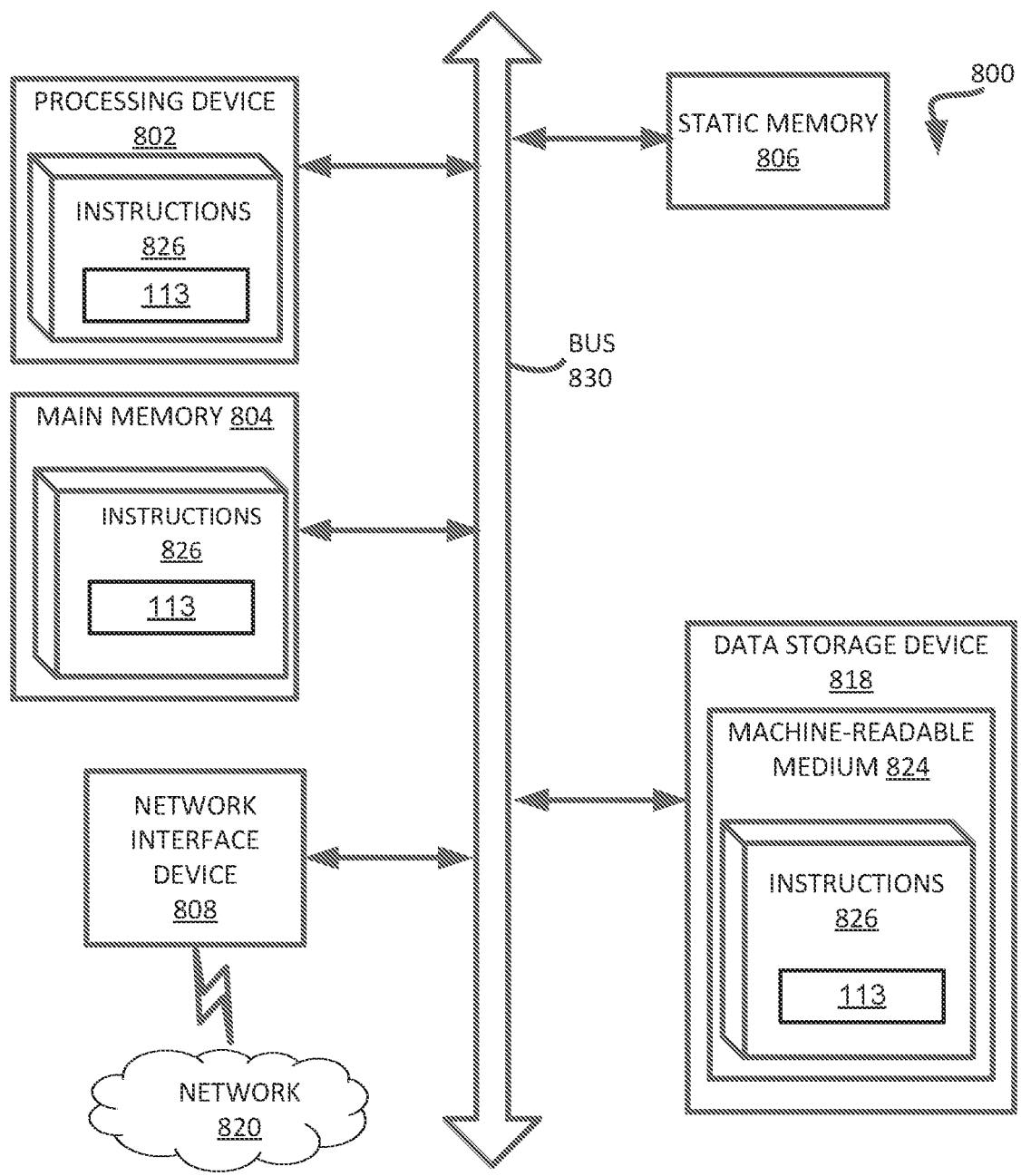
FIG. 8 is a block diagram of an example computer system in which implementations of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage condition component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to a voltage condition component (e.g., the voltage condition component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining that a first programming operation has been performed on a memory cell;
   identifying an amount of time that has elapsed since the first programming operation has been performed on the memory cell;
   determining whether the amount of time that has elapsed satisfies a threshold time condition; and
   in response to determining that the amount of time that has elapsed satisfies the threshold time condition, performing, by a processing device, an operation on the memory cell to change or maintain a voltage condition of the memory cell;
   wherein the operation on the memory cell to change or maintain the voltage condition of the memory cell corresponds to changing the memory cell from a state associated with an increased error rate to another state associated with a decreased error rate or maintaining the memory cell at the another state associated with the decreased error rate.

2. The method of claim 1, wherein the state associated with the increased error rate is a stable threshold voltage state of the memory cell, and wherein the another state associated with the decreased error rate is a transient threshold voltage state of the memory cell.

3. The method of claim 1, further comprising:
   determining that a second programming operation has not been performed on the memory cell, wherein the performing of the operation on the memory cell to change or maintain the voltage condition of the memory cell is further in response to determining that the second programming operation has not been performed on the memory cell.

4. The method of claim 1, wherein the amount of time that has elapsed satisfies the threshold time condition when the amount of time is equal to or exceeds a threshold amount of time.

5. The method of claim 1, further comprising:
in response to determining that the amount of time that has elapsed does not satisfy the threshold time condition, determining to not perform the operation on the memory cell to change or maintain the voltage condition of the memory cell.

6. The method of claim 1, wherein the first programming operation stores data at the memory cell, and wherein the identified amount of time that has elapsed corresponds to an elapsed time since the data was stored at the memory cell without a subsequent programming and read operation being performed at the memory cell.

7. A system comprising:
a memory; and
a processing device communicably coupled to the memory, the processing device to perform operations comprising:
determining that a first programming operation has been performed on a memory cell;
identifying an amount of time that has elapsed since the first programming operation has been performed on the memory cell;
determining whether the amount of time that has elapsed satisfies a threshold time condition; and
in response to determining that the amount of time that has elapsed satisfies the threshold time condition, performing an operation on the memory cell to change or maintain a voltage condition of the memory cell;
wherein the operation on the memory cell to change or maintain the voltage condition of the memory cell corresponds to changing the memory cell from a state associated with an increased error rate to another state associated with a decreased error rate or maintaining the memory cell at the another state associated with the decreased error rate.

8. The system of claim 7, wherein the state associated with the increased error rate is a stable threshold voltage state of the memory cell, and wherein the another state associated with the decreased error rate is a transient threshold voltage state of the memory cell.

9. The system of claim 8, wherein the operations further comprise:
determining that a second programming operation has not been performed on the memory cell, wherein the performing of the operation on the memory cell to change or maintain the voltage condition of the memory cell is further in response to determining that the second programming operation has not been performed on the memory cell.

10. The system of claim 7, wherein the amount of time that has elapsed satisfies the threshold time condition when the amount of time is equal to or exceeds a threshold amount of time.

11. The system of claim 7, wherein the operations further comprise:
in response to determining that the amount of time that has elapsed does not satisfy the threshold time condition, determining to not perform the operation on the memory cell to change or maintain the voltage condition of the memory cell.

12. The system of claim 7, wherein the first programming operation stores data at the memory cell, and wherein the identified amount of time that has elapsed corresponds to an elapsed time since the data was stored at the memory cell without a subsequent programming and read operation being performed at the memory cell.

13. A non-transitory machine-readable storage medium storing instructions that cause a processing device to perform operations comprising:
determining that a first programming operation has been performed on a memory cell;
identifying an amount of time that has elapsed since the first programming operation has been performed on the memory cell;
determining whether the amount of time that has elapsed satisfies a threshold time condition; and
in response to determining that the amount of time that has elapsed satisfies the threshold time condition, performing an operation on the memory cell to change or maintain a voltage condition of the memory cell;
wherein the operation on the memory cell to change or maintain the voltage condition of the memory cell corresponds to changing the memory cell from a state associated with an increased error rate to another state associated with a decreased error rate or maintaining the memory cell at the another state associated with the decreased error rate.

14. The non-transitory machine-readable storage medium of claim 13, wherein the state associated with the increased error rate is a stable threshold voltage state of the memory cell, and wherein the another state associated with the decreased error rate is a transient threshold voltage state of the memory cell.

15. The non-transitory machine-readable storage medium of claim 14, wherein the operations further comprise:
determining that a second programming operation has not been performed on the memory cell, wherein the performing of the operation on the memory cell to change or maintain the voltage condition of the memory cell is further in response to determining that the second programming operation has not been performed on the memory cell.

16. The non-transitory machine-readable storage medium of claim 14, wherein the amount of time that has elapsed satisfies the threshold time condition when the amount of time is equal to or exceeds a threshold amount of time.

17. The non-transitory machine-readable storage medium of claim 14, wherein the operations further comprise:
in response to determining that the amount of time that has elapsed does not satisfy the threshold time condition, determining to not perform the operation on the memory cell to change or maintain the voltage condition of the memory cell.

* * * * *